United States Patent
Irie et al.

(10) Patent No.: US 6,966,771 B2
(45) Date of Patent: Nov. 22, 2005

(54) BOAT FOR HEAT TREATMENT AND VERTICAL HEAT TREATMENT EQUIPMENT

(75) Inventors: Shinji Irie, Tokyo-To (JP); Hirofumi Sakai, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 10/500,125

(22) PCT Filed: Sep. 17, 2002

(86) PCT No.: PCT/JP02/09512

§ 371 (c)(1),
(2), (4) Date: Jun. 25, 2004

(87) PCT Pub. No.: WO03/060968

PCT Pub. Date: Jul. 24, 2003

(65) Prior Publication Data

US 2005/0042568 A1    Feb. 24, 2005

(30) Foreign Application Priority Data

Dec. 27, 2001  (JP)  ............... 2001-397884

(51) Int. Cl.[7] ............................................. F27D 5/00
(52) U.S. Cl. ................................. 432/253; 432/258
(58) Field of Search ........................... 432/253, 258, 432/81; 211/41.18

(56) References Cited

U.S. PATENT DOCUMENTS

| | | | |
|---|---|---|---|
| 6,287,112 B1 * | 9/2001 | Van Voorst Vader et al. ............ | 432/258 |
| 6,474,987 B1 * | 11/2002 | Nakai et al. ................ | 432/258 |
| 6,716,027 B2 * | 4/2004 | Kim et al. .................. | 432/253 |
| 6,796,439 B2 * | 9/2004 | Araki ...................... | 211/41.18 |

FOREIGN PATENT DOCUMENTS

| | | |
|---|---|---|
| JP | 09-237781 | 9/1997 |
| JP | 10-050626 | 2/1998 |
| JP | 11-031639 | 2/1999 |
| JP | 11-097362 | 4/1999 |
| JP | 11-260746 | 9/1999 |
| JP | 2000-269150 | 9/2000 |
| WO | WO 00/19502 | 4/2000 |
| WO | WO 01/18856 | 3/2001 |

OTHER PUBLICATIONS

International Preliminary Examination Report (PCT/IPEA/409) (translated) issued for PCT/JP2002/009512.
Notification of Transmittal of Copies of Translation of the International Preliminary Examination Report (PCT/IB/338) issued for PCT/JP2002/009512.

* cited by examiner

Primary Examiner—Gregory Wilson
(74) Attorney, Agent, or Firm—Smith, Gambrell & Russell, LLP

(57) ABSTRACT

The present invention is a boat for a thermal process including: a plurality of pillars; a plurality of claws formed in each of the pillars in a height direction at predetermined intervals; a plurality of supporting plates mounted in a tier-like manner between the plurality of pillars via the claws, each supporting plate having an object-to-be-processed mounting surface on which an object to be processed can be mounted; and a groove and a through hole provided in the object-to-be-processed mounting surface. According to the present invention, the groove and the through hole provided in the object-to-be-processed mounting surface form an air layer between the object-to-be-processed mounting surface of the supporting plate and the object to be processed, so that sticking of the object to be processed can be inhibited. Thus, even during a thermal process at a high temperature, generation of slip caused by the sticking of the object to be processed can be inhibited.

13 Claims, 5 Drawing Sheets

BOAT FOR HEAT TREATMENT AND VERTICAL HEAT TREATMENT EQUIPMENT

FIELD OF THE INVENTION

The present invention relates to a boat for a thermal process and a vertical thermal processing unit.

DESCRIPTION OF THE RELATED ART

In a manufacturing process of a semiconductor device, there is a step of conducting various thermal processes such as an oxidation process, a diffusion process, a CVD process, an annealing process, or the like, to an object to be processed, such as a semiconductor wafer. As a thermal processing unit for carrying out the step, a vertical thermal processing unit has been used, which is capable of thermally processing a large number of wafers at the same time. In the vertical thermal processing unit, a boat for a thermal process has been used, on which the large number of wafers are mounted.

As the boat for a thermal process, a ring boat that can support peripheral portions of the wafers by circular supporting plates thereof has been proposed (for example, JP Laid-Open No. 9-237781). In the case, slip (crystal defect) caused by gravity stress, which tends to be increased by wafer enlargement (for example, 300 mm in diameter), can be reduced. In addition, thermal capacity of a peripheral portion of a wafer, in which a heating and cooling rate is higher than that in a central portion thereof, is so increased that uniformity of the process within a surface may be enhanced.

Herein, in the above boat for a thermal process, if the surface of a supporting plate has a minute irregularity or projection, the reverse surface of a wafer may be damaged or slip by gravity stress may be generated more easily in the wafer. On the other hand, if the surfaces of the supporting plates are mirror ground in order to solve the above problems, the wafers tend to be undesirably stuck to the surfaces of the supporting plates. Thus, it is preferable that the surfaces of the supporting plates are made a little rough by mean of a sand blasting method or the like, after the surfaces of the supporting plates are ground.

However, in the case of the above boat for a thermal process, when the wafers are thermally processed at a high temperature of for example 1050° C. to 1200° C., sticking phenomenon of the wafers to the surfaces of the supporting plates may be generated. In addition, because of the sticking phenomenon and minute irregularities or projections on the surfaces of the supporting plates, slip by gravity stress may be generated partly in the wafers.

SUMMARY OF THE INVENTION

This invention is developed by focusing the aforementioned problems. An object of the present invention is to provide a boat for a thermal process and a vertical thermal processing unit that can inhibit generation of slip in an object to be processed during a thermal process at a high temperature.

The present invention is a boat for a thermal process comprising: a plurality of pillars; a plurality of claws formed in each of the pillars in a height direction at predetermined intervals; a plurality of supporting plates mounted in a tier-like manner between the plurality of pillars via the claws, each supporting plate having an object-to-be-processed mounting surface on which an object to be processed can be mounted; and a groove and a through hole provided in the object-to-be-processed mounting surface.

According to the present invention, the groove and the through hole provided in the object-to-be-processed mounting surface form an air layer between the object-to-be-processed mounting surface of the supporting plate and the object to be processed, so that sticking of the object to be processed can be inhibited. Thus, even during a thermal process at a high temperature, generation of slip caused by the sticking of the object to be processed can be inhibited.

Preferably, a minute irregularity is provided in the object-to-be-processed mounting surface in order to inhibit sticking of the object to be processed. In the case, the effect of inhibiting the sticking of the object to be processed can be increased.

In general, the object to be processed is substantially circular. Thus, it is preferable that the supporting plates are substantially circular, and that the plurality of pillars are arranged behind, on the left hand of, and on the right hand of the supporting plates, perpendicularly to the supporting plates. In the case, the object to be processed can be easily mounted and removed away.

In addition, preferably, the supporting plate has a left engaging part that can be engaged with a claw of the pillar on the left hand of the supporting plates in order to prevent dropping of the supporting plate, and a right engaging part that can be engaged with a claw of the pillar on the right hand of the supporting plates in order to prevent the dropping of the supporting plate. In the case, the dropping of the supporting plate caused by vibration or the like can be prevented.

For example, each of the left engaging part and the right engaging part is a stopper member that is abutted against a lateral wall part of the claw.

Alternatively, preferably, the supporting plate has a left engaging hole that can be engaged with an upper portion of a claw of the pillar on the left hand of the supporting plates, a right engaging hole that can be engaged with an upper portion of a claw of the pillar on the right hand of the supporting plates, and a back engaging hole that can be engaged with an upper portion of a claw of the pillar behind the supporting plates. In the case too, the dropping of the supporting plate caused by vibration or the like can be prevented.

In addition, preferably, dummy plates are mounted at an upper end portion and a lower end portion of the pillars. Specifically, preferably, a plurality of dummy plates is mounted in a tier-like manner between the plurality of pillars via the claws, at an upper end portion and a lower end portion of the pillars, respectively.

In general, the object to be processed is substantially circular. Thus, it is preferable that the dummy plates are substantially circular, and that the plurality of pillars are arranged behind, on the left hand of, and on the right hand of the dummy plates, perpendicularly to the dummy plates.

Then, preferably, the dummy plate has a dummy-plate left engaging part that can be engaged with a claw of the pillar on the left hand of the dummy plates in order to prevent dropping of the dummy plate, and a dummy-plate right engaging part that can be engaged with a claw of the pillar on the right hand of the dummy plates in order to prevent dropping of the dummy plate. In the case, the dropping of the dummy plate caused by vibration or the like can be prevented.

For example, each of the dummy-plate left engaging part and the dummy-plate right engaging part is a stopper member that is abutted against a lateral wall part of the claw.

Alternatively, preferably, the dummy plate has a dummy-plate left engaging hole that can be engaged with an upper portion of a claw of the pillar on the left hand of the dummy plates, a dummy-plate right engaging hole that can be engaged with an upper portion of a claw of the pillar on the right hand of the dummy plates, and a dummy-plate back engaging hole that can be engaged with an upper portion of a claw of the pillar behind the dummy plates. In the case too, the dropping of the dummy plate caused by vibration or the like can be prevented.

In addition, the present invention is a vertical thermal processing unit comprising: a boat for a thermal process including the above feature; and a thermal processing furnace that can contain the boat for a thermal process.

DESCRIPTION OF THE PREFERRED EMBODIMENT

Figure 1:
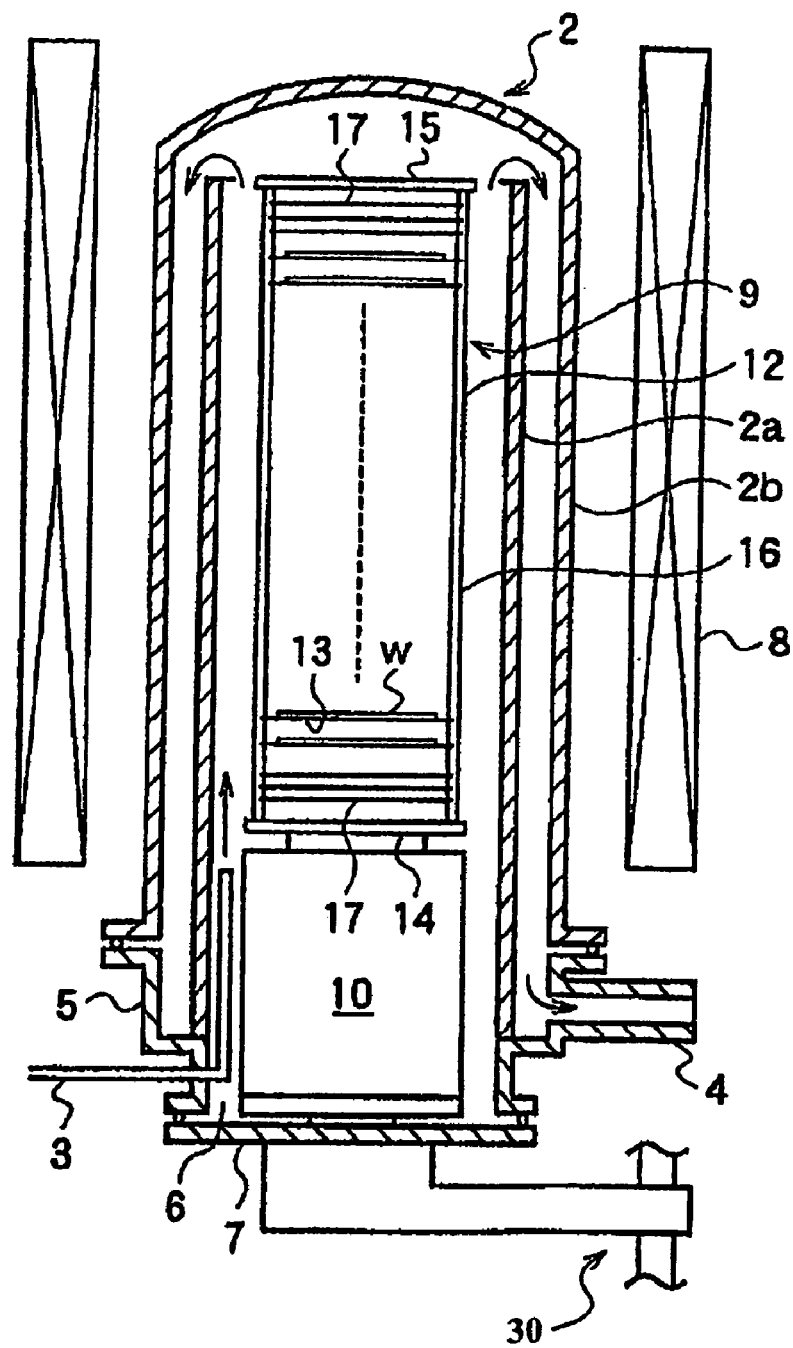
FIG. 1 is a sectional view showing a vertical thermal processing unit according to an embodiment of the present invention.
Figure 2A:
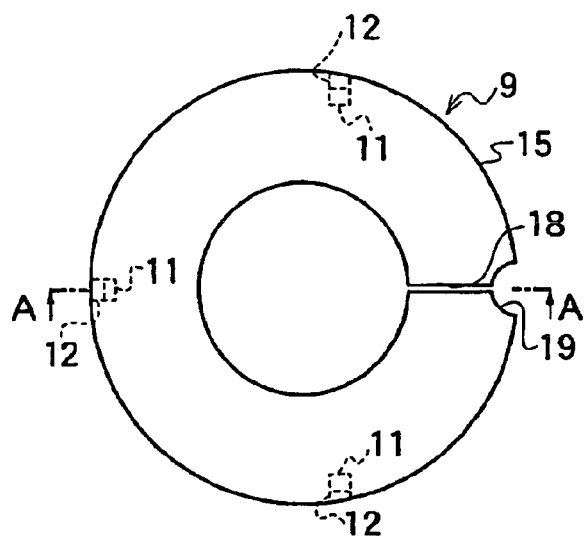
FIG. 2 is a view showing a boat body of a boat for a thermal process, (a) being a plan view, (b) being a longitudinal sectional view taken along an A—A line of (a)
Figure 2B:
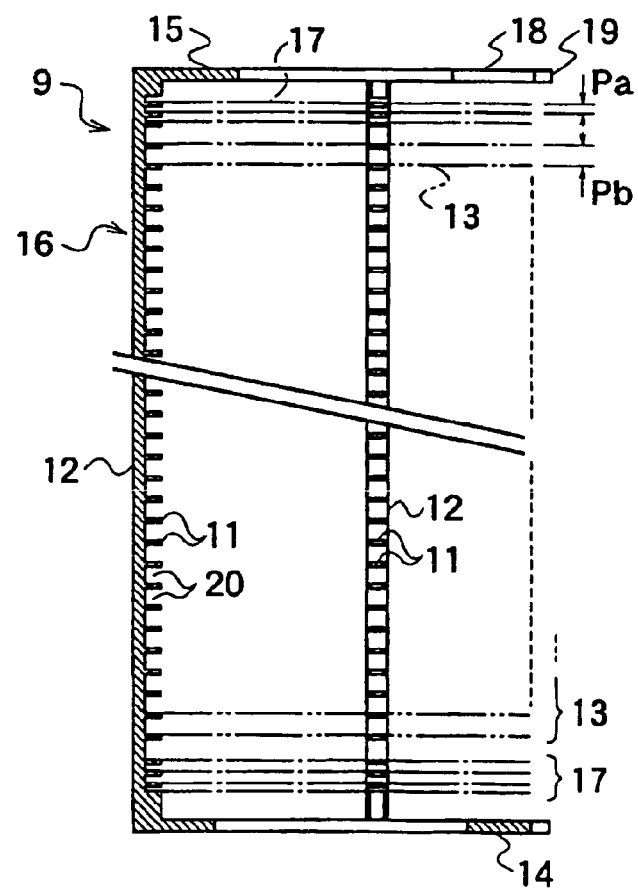
Figure 3:
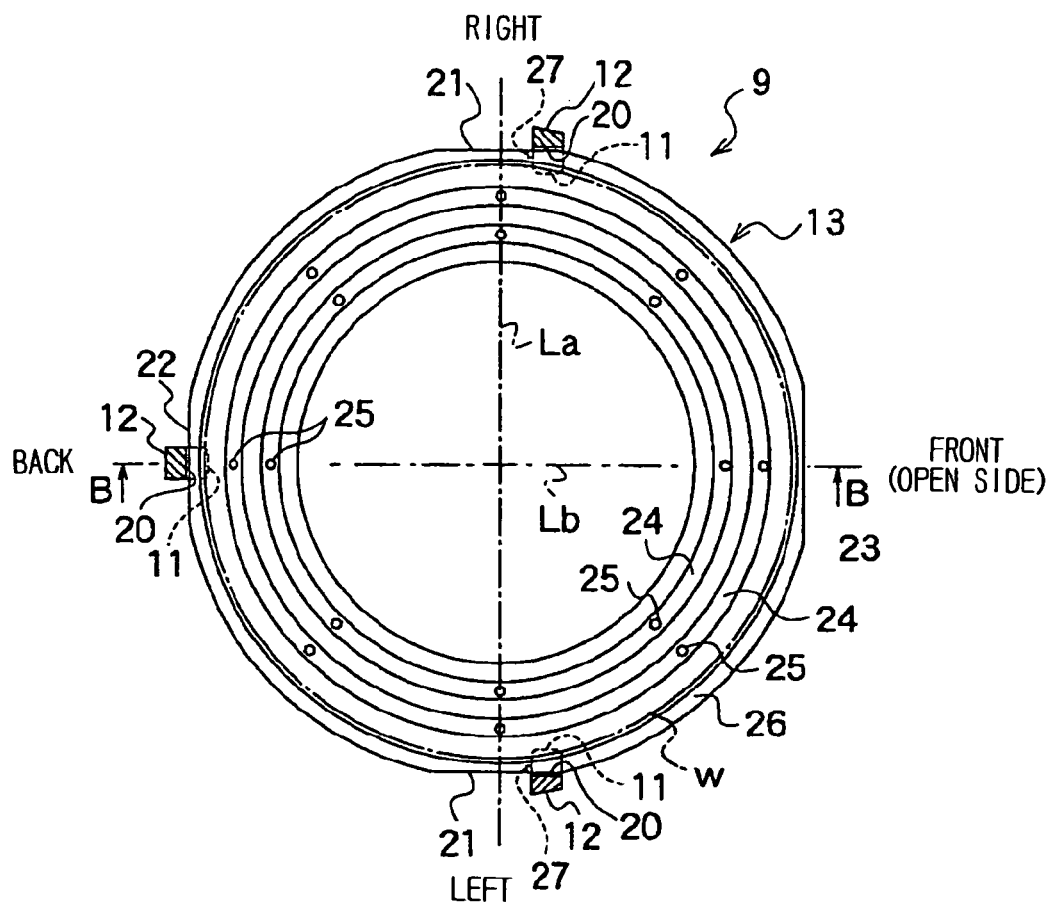
FIG. 3 is a transversal sectional view showing a supporting-plate portion of a boat for a thermal process.
Figure 4:
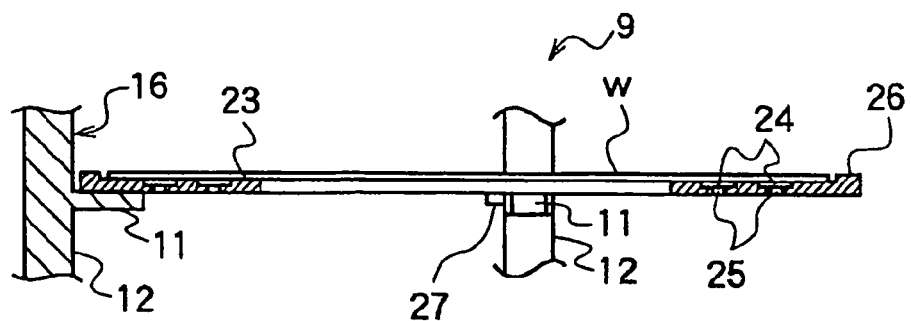
FIG. 4 is an enlarged sectional view taken along a B—B line of FIG. 3.
Figure 5:
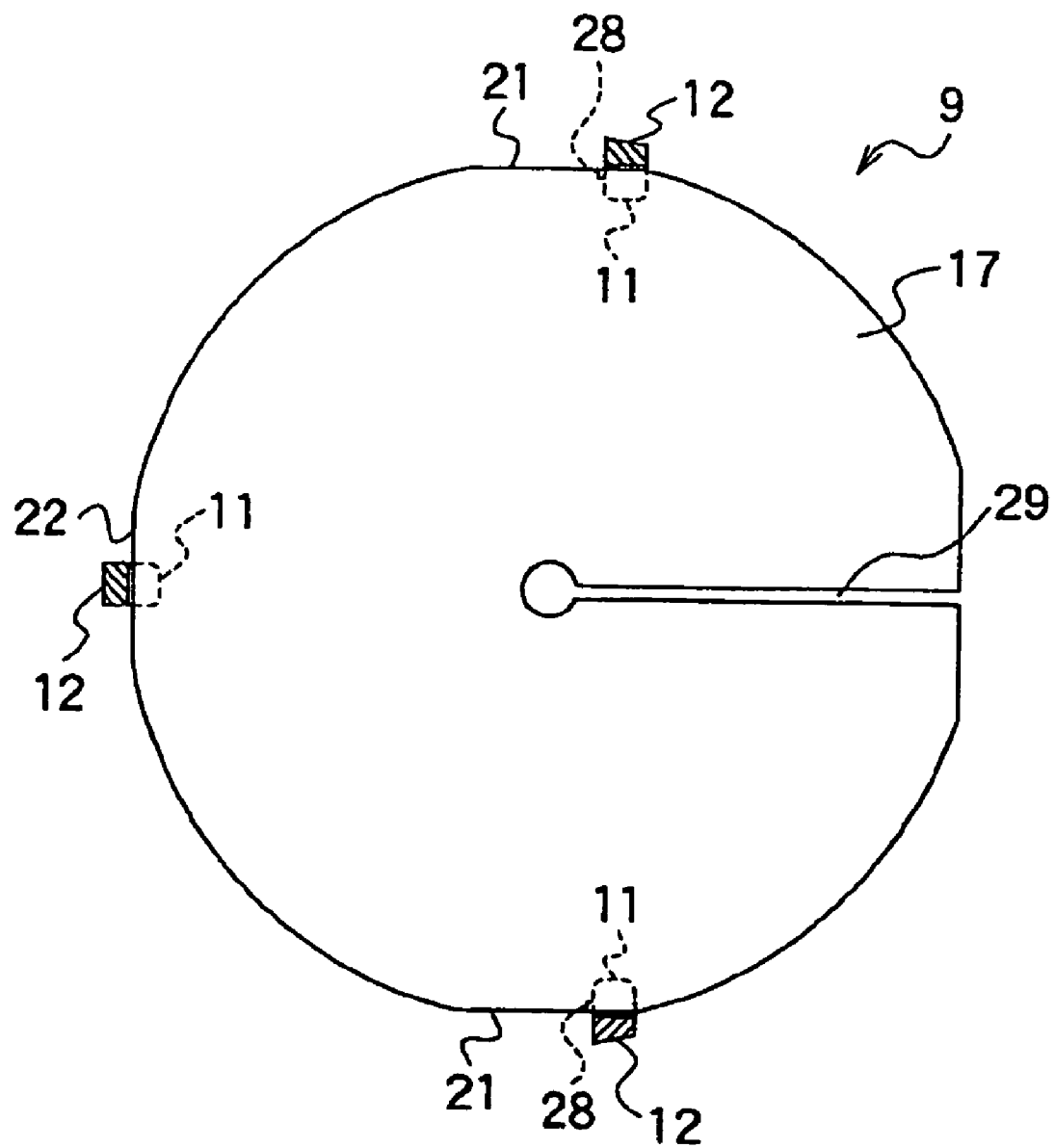
FIG. 5 is a transversal sectional view showing a dummy-plate portion of a boat for a thermal process.

Hereinafter, an embodiment of the present invention will be described with reference to the attached drawings. FIG. 1 is a sectional view showing a vertical thermal processing unit according to an embodiment of the present invention. FIGS. 2(a) and 2(b) are views showing a boat body of a boat for a thermal process. FIG. 3 is a transversal sectional view showing a supporting-plate portion of a boat for a thermal process. FIG. 4 is an enlarged sectional view taken along a B—B line of FIG. 3. FIG. 5 is a transversal sectional view showing a dummy-plate portion of a boat for a thermal process;

As shown in FIG. 1, the vertical thermal processing unit 1 has a reaction tube 2 (processing container) made of quartz, which forms a thermal processing furnace for containing an object to be processed such as a semiconductor wafer W and carrying out a predetermined process such as a CVD process.

In the embodiment, the reaction tube 2 has a double-tube structure of an inner tube 2a and an outer tube 2b, but the reaction tube 2 may have a single-tube structure of only an outer tube 2b. In addition, a circular manifold 5 is hermetically connected to a lower part of the reaction tube 2, the circular manifold 5 having a gas-introducing-pipe portion (gas introducing port) 3 for introducing a process gas or an inert gas for purge into the reaction tube 2 and a gas-discharging-pipe portion (gas discharging port) 4 for discharging gas from the reaction tube 2.

A pipe of a gas supplying system is connected to the gas-introducing-pipe portion 3. A pipe of a gas discharging system including a vacuum pump and/or a pressure controlling valve or the like, which is capable of reducing and controlling a pressure in the reaction tube 2, is connected to the gas-discharging-pipe portion 4 (omitted in the drawings). In addition, a cylindrical heater 8 is provided around the reaction tube 2 in such a manner that the inside of the reaction tube 2 can be heated and controlled to a predetermined temperature of for example 300 to 1200 ° C.

The manifold 5 at the lower end of the reaction tube 2 forms a furnace opening 6 of the thermal processing furnace. Under the thermal processing furnace, a lid 7 that opens and closes the furnace opening 6 is provided to be moved up and down by an elevating mechanism 30. The lid 7 is adapted to butt against an open end of the manifold 5 to hermetically close the furnace opening 6.

A boat for a thermal process 9 that supports a large number (for example, about 75 to 100) of large-diameter (for example, 300 mm in diameter) wafers W horizontally in a tier-like manner at intervals in a vertical direction is placed on the lid 7 via a heat retaining cylinder 10 that is a furnace-opening heat-insulating means. When the lid 7 is moved up by the elevating mechanism 30 the boat 9 is adapted to be loaded (conveyed) in the reaction tube 2. When the lid 7 is moved down, the boat 9 is adapted to be unloaded (conveyed out) from the reaction tube 2.

On the other hand, as shown in FIGS. 2 to 4, the boat for a thermal process 9 has: a plurality of (for example, three) pillars 12 having a plurality of claws 11 formed at predetermined intervals in a height direction; and a plurality of supporting plates 13 mounted in a tier-like manner via the claws 11 for mounting wafers W. More specifically, the boat for a thermal process 9 has a boat body 16 consisting of a bottom plate 14, a ceiling plate 15, and the plurality of pillars 12 extending between the bottom plate 14 and the ceiling plate 15. The supporting plates 13 are supported in a tier-like manner by the pillars 12 of the boat body 16 via the claws 11. In order to make uniform a thermal processing condition in the region wherein the plurality of supporting plates 13 occupy, a plurality of (for example, 3 to 4) dummy plates 17, as shown in FIG. 5, are supported both on the side of an upper end of the pillars 12 and on the side of a lower end thereof, via the claws 11. The pillars 12 are arranged at predetermined interval in a circumferential direction so as to surround the supporting plates 13 and the wafers W. The pillars 12, the bottom plate 14 and the ceiling plate 15 are integrally joined by means of welding or the like.

The boat body 16, the supporting plates 13 and the dummy plates 17 may be made of quartz in a case wherein they are used at a middle higher temperature, for example a thermal processing temperature not higher than 1000° C. However, it is preferable that they are made of silicon carbide (SiC) in a case wherein they are used at a relatively higher temperature, for example a thermal processing temperature of about 1050° C. to 1200° C. In the case, in order to prevent that the wafers W are contaminated by a silicon carbide material whose fineness is low, it is preferable that a protective film is formed by for example a CVD process onto the boat body 16, the supporting plates 13 and the dummy plates 17, after working process thereof. In addition, the supporting plates 13 and the dummy plates 17 are formed to substantially the same outer shape.

The ceiling plate 15 and the bottom plate 14 are formed to be circular, respectively. In a case wherein they are used for a thermal process at a high temperature, it is preferable to provide a slit 18 in the ceiling plate 15 for causing thermal stress to escape. In addition, in the embodiment, as shown in FIG. 2(a), a cut-out portion 19 for avoiding interference with a sticklike temperature detector is provided at a peripheral portion of each of the ceiling plate 15 and the bottom plate 14.

Regarding the boat body 16, in order to enable attaching and detaching (mounting and removing) of the supporting plates 13 and the dummy plates 17 as well as conveying-in and conveying-out of the wafers W in front of the boat body 16, the pillars 12 are arranged not in a front region thereof, but at at least three positions in a left region thereof, a right region thereof and a back region thereof. Four pillars 12 may be used by providing two pillars 12 at left and right positions in the back region.

In order to support the supporting plates 13 and the dummy plates 17 more stably, as shown in FIG. 3, the left and right pillars 12 are arranged a little ahead of a central line La extending in a left-right direction of the boat body 16. Then, the horizontal claws 11 are formed at predetermined pitch intervals on the inner sides of the pillars 12. The claws 11 can be formed by making the grooves 20 by whittling the inner sides of the pillars 12 by means of for example a rotary grinding blade which may be inserted through an open side of the boat body 16. In the case, it is preferable that the claws 11 are formed to be thin and small in order to inhibit thermal capacity of the claws 11 and to make uniform temperature within the surface of each wafer W.

In addition, a pitch interval Pa of the claws 11 supporting the dummy plates 17 is formed to be smaller than a pitch interval Pa of the claws 11 supporting the supporting plates 13, in order to assure a mounting region of the predetermined number of wafers W in a limited space in the boat body 16 of the boat for a thermal process 9, which is set based on a relationship of the height of the vertical thermal processing unit 1.

Back portions (back surfaces) of the grooves 20 of the left and right pillars 12 are formed to be in parallel with a central line Lb extending in a front-back direction of the boat body 16. In addition, a back portion (back surface) of the groove 20 of the back pillar 12 is formed to be in parallel with the central line La in the left-right direction of the boat body 16. Then, as shown in FIG. 3, in outer peripheries of the supporting plates 13 and the dummy plates 17, cut-out portions 21 in parallel with the back portions (back surfaces) of the grooves 20 of the left and right pillars 12 and cut-out portions 22 in parallel with the back portion (back surface) of the groove 20 of the back pillar 12 are formed. Thus, the supporting plates 13 and the dummy plates 17 can be surely and easily mounted onto the boat body 16.

The supporting plate 13 is formed to be circular in such a manner that an outer diameter thereof is a little larger than that of the circular wafer W in order to support a peripheral portion of the wafer W. Herein, in order to prevent that the reverse surface of the wafer W is damaged and/or that slip by gravity stress is generated in the wafer W, a wafer mounting surface (object-to-be-processed mounting surface) 23 of the supporting plate 13 is mirror ground, and then a minute irregularity (omitted in the drawings) is provided in the wafer mounting surface 23 of the supporting plate 13 by means of a surface-roughening process such as a sand blasting method, in order to inhibit sticking of the wafer W. Alternatively, instead of carrying out both the mirror grinding process and the surface-roughening process, a grinding process aiming at a predetermined desired surface roughness is also effective.

Then, in order to inhibit the phenomenon wherein the wafer W is stuck to the wafer mounting surface 23 of the supporting plate 13 even at a thermal process at a high temperature of for example 1050° C. to 1200° C., grooves 24 and through holes 25 are provided in the wafer mounting surface 23 of the supporting plate 13. In the embodiment, as shown in FIGS. 3 and 4, a plurality of, for example two, circular concentric grooves 24 are formed in the wafer mounting surface 23 of the supporting plate 13, and a plurality of through holes 25 vertically piercing the supporting plate 13 are provided in each groove 24 at predetermined intervals in a circumferential direction thereof. Although it is preferable that the plurality of grooves 24 is provided, only one groove may be provided. In addition, although it is preferable that the groove 24 is continuous in the circumferential direction thereof, the groove 24 may be formed to be intermittent in the circumferential direction thereof. In addition, although it is preferable that the groove 24 is circular, the groove 24 may be formed to be radial. Furthermore, the groove 24 may be formed to be meshy. That is, arrangement and/or shape of the groove 24 are not limited.

In addition, as shown in FIG. 4, it is preferable that a standing-up wall 26 to prevent dropping of the wafer W is provided in a peripheral portion of the supporting plate 13 to substantially the same height as the wafer W. However, the standing-up wall 26 may be unnecessary as it is not easy for the wafer W to slide on the wafer mounting surface 23 of the supporting plate 13 because of the minute irregularity (surface-roughening process), the grooves 24 and the through holes 25 (which cause air remaining between the wafer and the wafer mounting surface at a wafer mounting to escape).

In addition, stopper members 27 are provided on the supporting plate 13, as a left engaging part and a right engaging part that can be engaged with claws 11 of the pillars 12 on the left and the right hands in order to prevent dropping of the supporting plate 13. The stopper members 27 project downward from left and right edge portions of the reverse surface of the supporting plate 13, respectively. When the stopper members 27 are respectively butted against lateral surfaces on the back side of the left and right claws 11 to be engaged therewith, forward movement of the supporting plate 13 is adapted to be blocked. Herein, movement of the supporting plate 13 in a backward direction and in the left-right direction is blocked by the pillars 12.

In order to inhibit thermal capacity of the stopper members 27 and to make uniform temperature within the surface of a wafer W, it is preferable that the stopper members 27 are formed to be thin and small. In addition, because of the same reason, the reverse surface of the supporting plate 13 is formed to be as flat as possible except for the stopper members 27.

As shown in FIG. 5, similarly to the supporting plate 13, stopper members 28 are provided on the dummy plate 17, as a dummy-plate left engaging part and a dummy-plate right engaging part that can be engaged with claws 11 of the pillars 12 on the left and the right hands in order to prevent dropping of the dummy plate 17. Herein, it is preferable that a slit 29 for causing thermal stress to escape is provided in a radial direction forward from a center of the dummy plate 17 in a case wherein the dummy plate 17 is used for a thermal process at a high temperature.

According to the above boat for a thermal process 9 or the vertical thermal processing unit 1 using the boat for a thermal process 9, the supporting plates 13 for mounting the wafers W are mounted in a tier-like manner to the plurality of pillars 12 via the claws 11, the pillars 12 having the claws 11 formed at predetermined intervals in a height direction, and the grooves 24 and the through holes 25 are provided in the wafer mounting surface 23 of the supporting plate 13. Thus, an air layer is formed between the wafer mounting surface 23 of the supporting plate 13 and the wafer W, so that the sticking of the wafer W is inhibited by the air layer. Thus, even at a thermal process at a high temperature, the sticking of the wafer W can be prevented, and generation of slip caused by gravity stress partly in the wafer W, which is caused by the minute irregularity and projections on the wafer mounting surface 23, can be inhibited.

In addition, the stopper members 27 that can be engaged with claws 11 of the pillars 12 on the left and the right hands to prevent dropping of a supporting plate 13 are provided on the supporting plate 13. Thus, the dropping of the supporting plate 13 caused by vibration or the like can be prevented. That is, shock-resistance and durability can be improved. In addition, the dummy plates 17 are mounted at the upper end portion and the lower end portion of the pillars 12 via the claws 11, and the stopper members 28 that can be engaged with claws 11 of the pillars 12 on the left and the right hands to prevent dropping of a dummy plate 17 are provided on the dummy plate 17. Thus, the dropping of the dummy plate 17 caused by vibration or the like can be prevented. That is, shock-resistance and durability can be improved.

If the dummy plate 17 is made of SiC, the dummy plate 17 may be made by molding. In the case, differently from a dummy wafer made by slicing ingot, the stopper members 28 may be easily formed integrally. In addition, regarding the boat for a thermal process 9, the boat body 16 and the supporting plates 13 are formed separately. Thus, manufacturing thereof, cleaning thereof, replacement of the supporting plates 13, and the like are easy.

The embodiment of the present invention is explained above in detail with reference to the drawings. However, the present invention is not limited to the above embodiment, but may be variously modified or changed within the substance of the present invention. For example, in order to facilitate transfer of the wafers W by a transferring mechanism, the supporting plate 13 may be formed into a horseshoe shape whose front side is open. In addition, a material for the boat body 16, the supporting plates 13 and the dummy plates 17 is preferably silicon carbide, but may be poly-silicon (Si). The object to be processed may be a LVD substrate or the like, instead of the semiconductor wafer.

Figure 6:
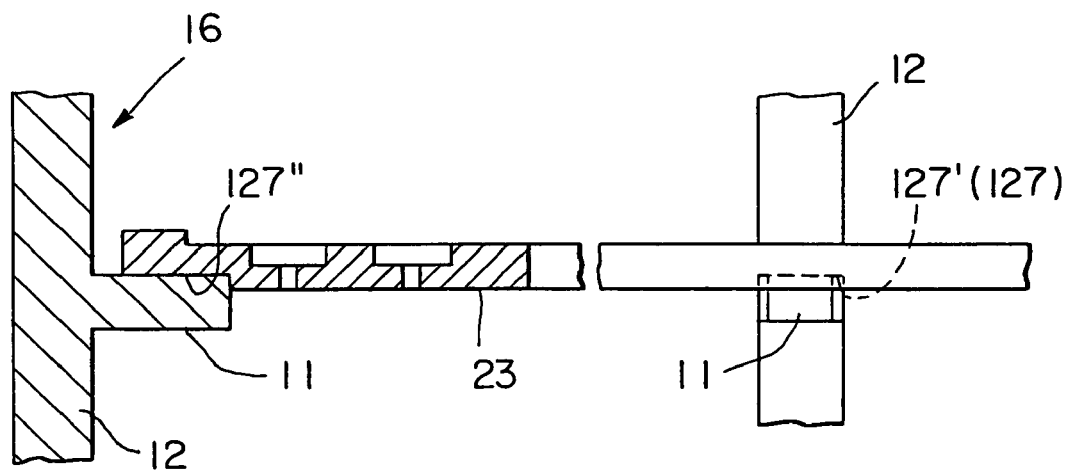
FIG. 6 is a view similar to FIG. 4 for explaining an effect that an engaging hole prevents dropping of a supporting plate.
Figure 7:
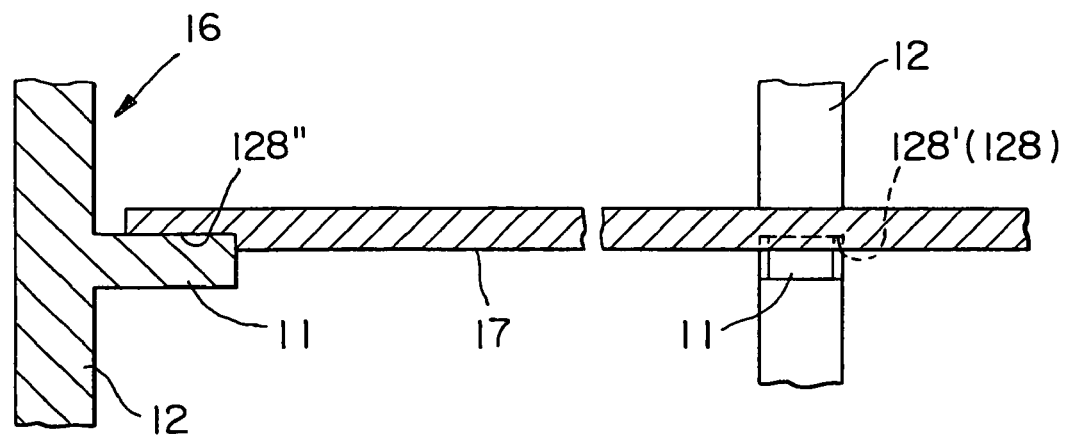
FIG. 7 is a view similar to FIG. 6 for explaining an effect that a dummy-plate engaging hole prevents dropping of a dummy plate.

Regarding the function of preventing the dropping of the supporting plate 13 and the dummy plate 17, instead of the stopper members 27, 28, engagement holes as shown in FIGS. 6 and 7 may be used.

In the case shown in FIG. 6, on the reverse surface of the supporting plate 13, a left engaging hole 127 that can be engaged with an upper portion of a claw of the pillar on the left hand of the supporting plates 13, a right engaging hole 127' that can be engaged with an upper portion of a claw of the pillar on the right hand of the supporting plates 13, and a back engaging hole 127" that can be engaged with an upper portion of a claw of the pillar behind the supporting plates 13 are provided to prevent dropping of the supporting plate 13.

Regarding the dummy plate 17, the same structure may be adopted to prevent dropping thereof. That is, as shown in FIG. 7, on the reverse surface of the dummy plate 17, a dummy-plate left engaging hole 128 that can be engaged with an upper portion of a claw of the pillar on the left hand of the dummy plates 17, a dummy-plate right engaging hole 128' that can be engaged with an upper portion of a claw of the pillar on the right hand of the dummy plates 17, and a dummy-plate back engaging hole 128" that can be engaged with an upper portion of a claw of the pillar behind the dummy plates 17 are provided to prevent dropping of the dummy plate 17.

What is claimed is:

1. A boat for a thermal process comprising:
    a plurality of pillars,
    a plurality of claws formed in each of the pillars in a height direction at predetermined intervals,
    a plurality of supporting plates mounted in a tier-like manner between the plurality of pillars via the claws, each supporting plate having an object-to-be-processed mounting surface on which an object to be processed can be mounted, and
    a groove and a through hole provided in the object-to-be-processed mounting surface,
wherein
    the plurality of pillars are arranged at least on the left hand and on the right hand of the supporting plated, and
    the supporting plate has
        a left engaging part that can be engaged with a claw of the pillar on the left hand of the supporting plates in order to prevent dropping of the supporting plate, and
        a right engaging part that can be engaged with a claw of the pillar on the right hand of the supporting plates in order to prevent the dropping of the supporting plate.

2. A boat for a thermal process according to claim 1, wherein
    a minute irregularity is provided in the object-to-be-processed mounting surface in order to inhibit sticking of the object to be processed.

3. A boat for a thermal process according to claim 1, wherein
    the supporting plates are substantially circular, and
    the plurality of pillars are arranged behind, on the left hand of, and on the right hand of the supporting plates, perpendicularly to the supporting plates.

4. A boat for a thermal process according to claim 3, wherein
    the supporting plate has
    a left engaging hole that can be engaged with an upper portion of a claw of the pillar on the left hand of the supporting plates,
    a right engaging hole that can be engaged with an upper portion of a claw of the pillar on the right hand of the supporting plates, and
    a back engaging hole that can be engaged with an upper portion of a claw of the pillar behind the supporting plates.

5. A boat for a thermal process according to claim 1, wherein
    the supporting plate is substantially circular,
    a plurality of circular grooves are concentrically provided, and
    a plurality of through holes are arranged in each circular groove at predetermined intervals in a circumferential direction of the circular groove.

6. A boat for a thermal process according to claim 1, wherein
    each of the left engaging part and the right engaging part is a stopper member that is abutted against a lateral wall part of the claw.

7. A boat for a thermal process according to claim 1, wherein
dummy plates are mounted at an upper end portion and a lower end portion of the pillars.

8. A boat for a thermal process according to claim 1, wherein
a plurality of dummy plates are mounted in a tier-like manner between the plurality of pillars via the claws, at an upper end portion and a lower end portion of the pillars, respectively.

9. A boat for a thermal process according to claim 8, wherein
the dummy plates are substantially circular, and
the plurality of pillars are arranged behind, on the left hand of, and on the right hand of the dummy plates, perpendicularly to the dummy plates.

10. A boat for a thermal process according to claim 9, wherein
the dummy plate has
a dummy-plate left engaging part that can be engaged with a claw of the pillar on the left hand of the dummy plates in order to prevent dropping of the dummy plate, and
a dummy-plate right engaging part that can be engaged with a claw of the pillar on the right hand of the dummy plates in order to prevent the dropping of the dummy plate.

11. A boat for a thermal process according to claim 10, wherein
each of the dummy-plate left engaging part and the dummy-plate right engaging part is a stopper member that is abutted against a lateral wall part of the claw.

12. A boat for a thermal process according to claim 9, wherein
the dummy plate has
a dummy-plate left engaging hole that can be engaged with an upper portion of a claw of the pillar on the left hand of the dummy plates,
a dummy-plate right engaging hole that can be engaged with an upper portion of a claw of the pillar on the right hand of the dummy plates, and
a dummy-plate back engaging hole that can be engaged with an upper portion of a claw of the pillar behind the dummy plates.

13. A vertical thermal processing unit comprising:
a boat for a thermal process according to claim 1, and
a thermal processing furnace that can contain the boat for a thermal process.

* * * * *